US012765025B2

(12) United States Patent
Oh et al.

(10) Patent No.: US 12,765,025 B2

(45) Date of Patent: Oct. 13, 2026

(54) SILICON CARBIDE POWER SEMICONDUCTOR DEVICE HAVING UNIFORM CHANNEL LENGTH AND MANUFACTURING METHOD THEREOF

(71) Applicant: TRinno Technology Co., Ltd., Seoul (KR)

(72) Inventors: Kwang Hoon Oh, Seoul (KR); Jin Young Jung, Seoul (KR); Soo Seong Kim, Seoul (KR)

(73) Assignee: TRinno Technology Co., Ltd., Seoul (KR)

( * ) Notice: Subject to any disclaimer, the term of this patent is extended or adjusted under 35 U.S.C. 154(b) by 831 days.

(21) Appl. No.: 18/162,816

(22) Filed: Feb. 1, 2023

(65) Prior Publication Data

US 2024/0136402 A1 Apr. 25, 2024
US 2024/0234508 A9 Jul. 11, 2024

(30) Foreign Application Priority Data

Oct. 24, 2022 (KR) ........................ 10-2022-0137710

(51) Int. Cl.
*H01L 29/417* (2006.01)
*H10D 12/01* (2025.01)
(Continued)

(52) U.S. Cl.
CPC ....... *H10D 62/8325* (2025.01); *H10D 12/031* (2025.01); *H10D 30/66* (2025.01);
(Continued)

(58) Field of Classification Search
CPC .. H10D 62/8325; H10D 12/031; H10D 30/66; H10D 62/127; H10D 62/393;
(Continued)

(56) References Cited

U.S. PATENT DOCUMENTS 11,489,046 B2 * 11/2022 Ohashi ................. H10D 84/146
2015/0372089 A1 12/2015 Bolotnikov et al.

FOREIGN PATENT DOCUMENTS

JP 6777975 B2 10/2020
KR 20170082834 A 7/2017
KR 20190002224 A 1/2019

* cited by examiner

*Primary Examiner* — Cuong B Nguyen
(74) *Attorney, Agent, or Firm* — Secant IP, PLLC; Donald J. Perreault

(57) ABSTRACT

Silicon carbide power semiconductor device having uniform channel length and manufacturing method thereof disclosed. The power semiconductor device includes a drift region of a first conductivity type, a plurality of body regions of a second conductivity type, being formed to be spaced apart from each other with a preset $W_S$ in a horizontal direction in an upper region of the drift region, a JFET region of the first conductivity type and a low-resistance region of the first conductivity type, being formed in a separation space between adjacent body regions to contact their side surfaces with the adjacent body regions and a source region of the first conductivity type, being formed in a surface region in the body region in contact with the low-resistance region to be spaced apart from the low-resistance region by a preset channel length.

7 Claims, 7 Drawing Sheets

(51) Int. Cl.

| | |
|---|---|
| ***H10D 30/66*** | (2025.01) |
| ***H10D 62/10*** | (2025.01) |
| ***H10D 62/17*** | (2025.01) |
| ***H10D 62/832*** | (2025.01) |
| ***H10D 64/23*** | (2025.01) |

(52) U.S. Cl.
CPC ......... *H10D 62/127* (2025.01); *H10D 62/393* (2025.01); *H10D 64/252* (2025.01)

(58) Field of Classification Search
CPC ............... H10D 64/252; H10D 62/157; H10D 30/0291; H10D 62/152
See application file for complete search history.

JFET region profile(retrograde doping)

JFET region profile(Box profile)

SILICON CARBIDE POWER SEMICONDUCTOR DEVICE HAVING UNIFORM CHANNEL LENGTH AND MANUFACTURING METHOD THEREOF

FIELD

The present invention relates to a silicon carbide power semiconductor device having uniform channel length and manufacturing method thereof.

RELATED ART

Power semiconductor devices such as IGBT (insulated gate bipolar transistor), power MOSFET (metal-oxide-semiconductor field effect transistor) and various types of thyristors, which are important elements in the field of power electronics, are being developed to meet various requirements (e.g., high breakdown voltage, low conduction loss, high switching speed, low switching loss, etc.) in various industrial fields as well as automotive applications.

As a material for fabricating power semiconductor devices, since silicon carbide (SiC) has ten times higher maximum critical electric field and three times larger energy band gap than those of silicon (Si), it is advantageous to fabricate excellent power semiconductor devices having a high breakdown voltage (BV). For this reason, various researches on processes or structures are being conducted to implement a SiC power semiconductor device.

FIG. 1 is a cross-sectional view of a silicon carbide power MOSFET according to the prior art.

Referring to FIG. 1, the silicon carbide power MOSFET is fabricated with a semiconductor substrate, which is an epitaxially grown N− conductivity type drift region 20 formed on the N+ conductivity type silicon carbide semiconductor substrate 50. And a MOS structure is formed on a surface region of the semiconductor substrate.

A plurality of P conductivity type body regions 30 are formed to be spaced apart from each other in a horizontal direction in the surface region of the semiconductor substrate where the MOS structure is formed, and a gate oxide 47 is formed on the semiconductor to span the adjacent body regions 30 and a gate electrode 49 is formed on the gate oxide 47.

In the body region 30, an N+ conductivity type source region 40 is formed to correspond to the edge of the gate electrode 49, and a P+ conductivity type contact region 32 is formed in contact with the source region 40. A source metal 45 is formed on the semiconductor substrate to be electrically connected to the source region 40 and the contact region 32. In addition, a drain metal 60 is formed on a back surface of the silicon carbide semiconductor substrate 50.

In the above structure, when an appropriate voltage is applied to the gate electrode 49, an inversion layer is formed in the channel region located under the gate electrode 49 in the body region 30, and the silicon carbide power MOSFET operates as a transistor.

In the case of a power MOSFET made of silicon, a self-alignment process is available because a gate structure is first formed and the N+ conductivity type source region 40 can be formed using the gate structure as a mask.

However, in the case of a power MOSFET made of silicon carbide, a high-temperature thermal process of about 1,500 degrees or more must be performed after implanting ions into the semiconductor substrate, so that implantation regions such as the body region 30, the source region 40 and the contact region 32 must be formed before forming the gate structure.

For this reason, it is difficult to apply a self-alignment process to silicon carbide power MOSFETs, and since separate masks should be used when forming the body region 30 and the source region 40, during the photo process, there is a in which channel lengths (Lch1 and Lch2 in FIG. 1) on both sides become non-uniform (Lch1≠Lch2) due to misalignment.

In this way, if the channel length is asymmetrical in the transistor cell of the silicon carbide power MOSFET, a deviation in current density per transistor cell occurs during switching on/off and conduction, and a ruggedness of the device is weakened due to thermal stress in a overcurrent conduction region in a transient state.

The above-mentioned related art is technical information possessed by the inventor for derivation of the present invention or acquired in the derivation process of the present invention, and cannot necessarily be said to be a known technique disclosed to the general public prior to the filing of the present invention.

SUMMARY

The present invention provide a silicon carbide power semiconductor device and manufacturing method thereof capable of enhancing ruggedness of the device by uniformizing a channel length to prevent variation in current density per transistor cell during switching on/off and conduction.

The present invention provides a silicon carbide power semiconductor device and manufacturing method thereof capable of reducing the number of masks required in manufacturing a power semiconductor device and reducing the complexity of a manufacturing process, by sharing a mask for forming a source region and a low-resistance region and a mask for forming a JFET region.

Other objects of the present invention will be easily understood through the following description.

According to one aspect of the present invention, there is provided a power semiconductor device. The power semiconductor device may include a drift region of a first conductivity type, a plurality of body regions of a second conductivity type, being formed to be spaced apart from each other with a preset $W_S$ in a horizontal direction in an upper region of the drift region, a JFET region of the first conductivity type and a low-resistance region of the first conductivity type, being formed in a separation space between adjacent body regions to contact their side surfaces with the adjacent body regions and a source region of the first conductivity type, being formed in a surface region in the body region in contact with the low-resistance region to be spaced apart from the low-resistance region by a preset channel length, wherein the JFET region is formed in a lower region of the separation space with a width equal to a separation width $W_S$, and the low-resistance region is formed in an upper region of the separation space in contact with the JFET region, wherein the low-resistance region forms an overlap region in a lateral direction by an overlap length OL1 with adjacent body region in a first direction, forms with an overlap region in the lateral direction by an overlap length OL2 with adjacent body region in a second direction opposite to the first direction so as to be formed with a width length $W_S$+OL1+OL2, wherein the overlap lengths OL1 and OL2 that the low-resistance region forms with adjacent body regions do not match.

In one embodiment, the drift region may be epitaxially grown on a silicon carbide substrate of the first conductivity type.

In one embodiment, the JFET region, the low resistance region, and the source region may be each formed by applying a same mask, and in a process of forming the JFET region of the first conductivity type in a lower region of the low-resistance region that does not overlap, an impurity of the first conductivity type may be implanted to a lower region of the overlapped low-resistance region and also to a lower region of the source region, wherein an impurity concentration for forming the JFET region may be set relatively low compared to an impurity concentration of the body region in order for an impurity concentration of the body region of the second conductivity type to be maintained as the body region of the second conductivity type while the impurity concentration of the second conductivity type in the body region in a lateral direction may become non-uniform by an impurity implant of the first conductivity type.

In one embodiment, the doses of the body region, the JFET region, the low resistance region and the source region formed by ion implant may have a relationship of low resistance region=source region>body region>JFET region.

In one embodiment, each of the overlap lengths OL1 and OL2 may be a value within a range from 0 to a preset limit value, and the limit value limiting the range of the region in which the low-resistance region is shiftable in the lateral direction relative to the JFET region may be set to a value equal to or relatively larger than a misalignment margin preset for a photolithography process of forming the source region and the body region.

In one embodiment, the body region is formed by Al ion implant, and the source region and the low resistance region may be formed by ion implant of at least one of N (Nitrogen) and Ph (Phosphorus).

In one embodiment, the JFET region may be formed by implanting the first conductivity type ions at a dose of 1e12/$cm^2$ or more and less than 1e13/$cm^2$ at an intermediate position from a bottom depth of the low-resistance region to a bottom depth of the body region.

In one embodiment, the power semiconductor device may be a MOSFET or an insulated gate bipolar transistor.

According to another aspect of the present invention, there is provided a method of manufacturing a power semiconductor device. The method may include (a) forming a plurality of body regions of a second conductivity type to be spaced apart from each other with a preset $W_S$ in a horizontal direction in an upper region of a drift region epitaxially grown on a silicon carbide substrate of a first conductivity type, (b) forming, by an ion implant of the first conductivity type with a first mask, a low-resistance region of the first conductivity type in an upper region of a separation space between adjacent body regions to contact their side surfaces with the adjacent body regions and forming a source region of the first conductivity type in a surface region in the body region in contact with the low-resistance region to be spaced apart from the low-resistance region by a preset channel length and (c) forming, by the ion implant of the first conductivity type with a first mask, a JFET region of the first conductivity type with a width length of the separation width $W_S$ in a lower region of the separation space, wherein in (b), the low-resistance region forms an overlap region in a lateral direction by an overlap length OL1 with adjacent body region in a first direction, forms with an overlap region in the lateral direction by an overlap length OL2 with adjacent body region in a second direction opposite to the first direction so as to be formed with a width length $W_S$+OL1+OL2, wherein an ion implant concentration in (c) is set relatively lower than an ion implant concentration of the body region so that the body region is maintained at a lower region of the source region and a lower portion of the low-resistance region that does not overlap.

In one embodiment, the overlap lengths OL1 and OL2 that the low-resistance region forms with adjacent body regions may not match.

In one embodiment, the doses of the body region, the JFET region, the low resistance region and the source region formed by ion implant may have a relationship of low resistance region=source region>body region>JFET region.

In one embodiment, each of the overlap lengths OL1 and OL2 is a value within a range from 0 to a preset limit value, wherein the limit value limiting the range of the region in which the low-resistance region is shiftable in the lateral direction relative to the JFET region is set to a value equal to or relatively larger than a misalignment margin preset for a photolithography process of forming the source region and the body region.

Aspects, features, advantages other than above described will be apparent from the following drawings, claims and detailed description.

It is advantageous that the uniformity of channel length of the silicon carbide power semiconductor device according to one embodiment of the present invention prevents variations in current density per transistor cell during switching on/off and conduction, thereby enhancing ruggedness of the device.

It is also advantageous that the sharing a mask for forming a source region and a low-resistance region and a mask for forming a JFET region can reduce the number of masks required in manufacturing the power semiconductor device and the complexity of the manufacturing process.

Advantages obtainable in the present invention are not limited to the mentioned above, and other advantages not mentioned can be clearly understood by those skilled in the art from the description below.

BRIEF DESCRIPTION OF ACCOMPANYING DRAWINGS

DESCRIPTION OF EMBODIMENTS

Figure 1:
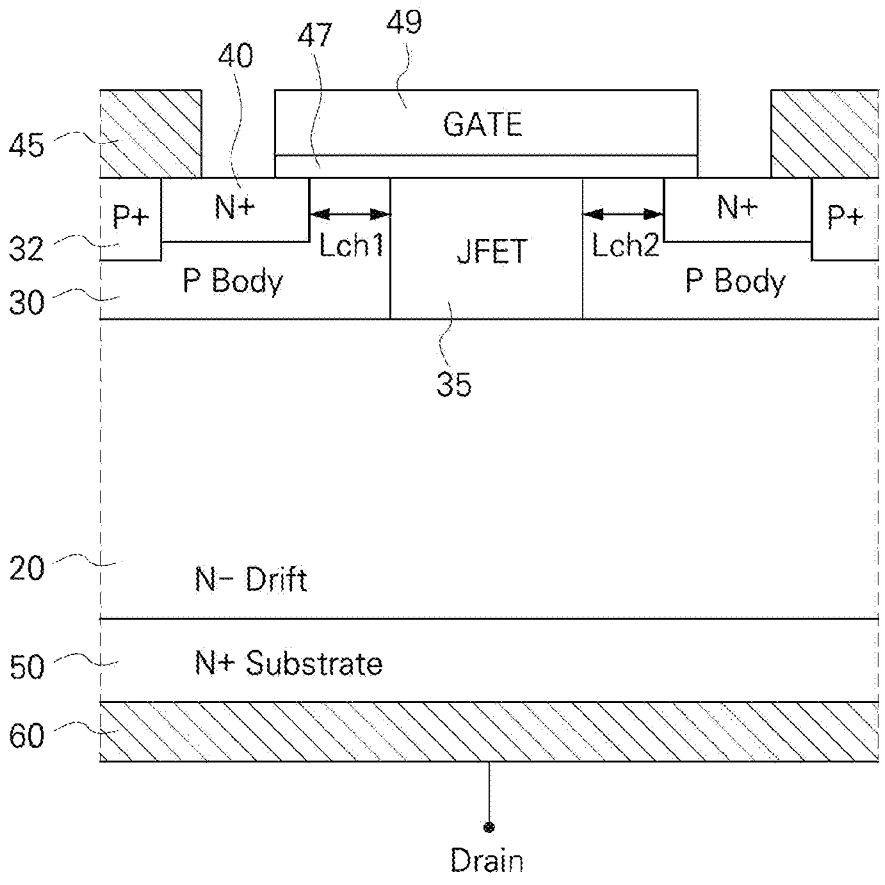
FIG. 1 PRIOR ART
FIG. 1 is a cross-sectional view of a silicon carbide power MOSFET according to the prior art.

The invention can be modified in various forms and specific embodiments will be described and shown below. However, the embodiments are not intended to limit the invention, but it should be understood that the invention includes all the modifications, equivalents, and replacements belonging to the concept and the technical scope of the invention. In describing the present invention, if it is determined that a detailed description of a related known technology may obscure the gist of the present invention, the detailed description thereof will be omitted.

Terms such as first, second, etc., may be used to refer to various elements, but, these elements should not be limited due to these terms. These terms will be used to distinguish one element from another element.

The terms used in the following description are intended to merely describe specific embodiments, but not intended to limit the invention. An expression of the singular number includes an expression of the plural number, so long as it is clearly read differently. The terms such as "include" and "have" are intended to indicate that features, numbers, steps, operations, elements, components, or combinations thereof used in the following description exist and it should thus be understood that the possibility of existence or addition of one or more other different features, numbers, steps, operations, elements, components, or combinations thereof is not excluded.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout the specification.

Relative terms, such as "below" or "above" or "upper" or "lower" or "horizontal" or "lateral" or "vertical" may be used herein to describe-one element, layer or region's relationship to another elements, layers or regions as illustrated in the Figures. It will be understood that relative terms are intended to encompass different orientations of the device in addition to the orientation depicted in the Figures.

In the following description and accompanying drawings, "−" or "+" may be added next to doping type "N" or "P" to indicate relative doping concentration. For example, "N−" means a doping concentration lower than that of an "N" doped region, and an "N+" doped region has a higher doping concentration than that of the "N" doped region. However, doped regions of the same relative doping concentration do not necessarily have the same absolute doping concentration. For example, two different "N" doped regions can have the same or different absolute doping concentrations.

Hereinafter, an embodiment of the present invention will be described in detail with reference to the accompanying drawings. However, in the following description, power MOSFET will be mainly described, but it should be understood that the technical concept of the present invention may be applied and expanded to various types of semiconductor devices such as IGBT in the same or similar manner.

Figure 2:
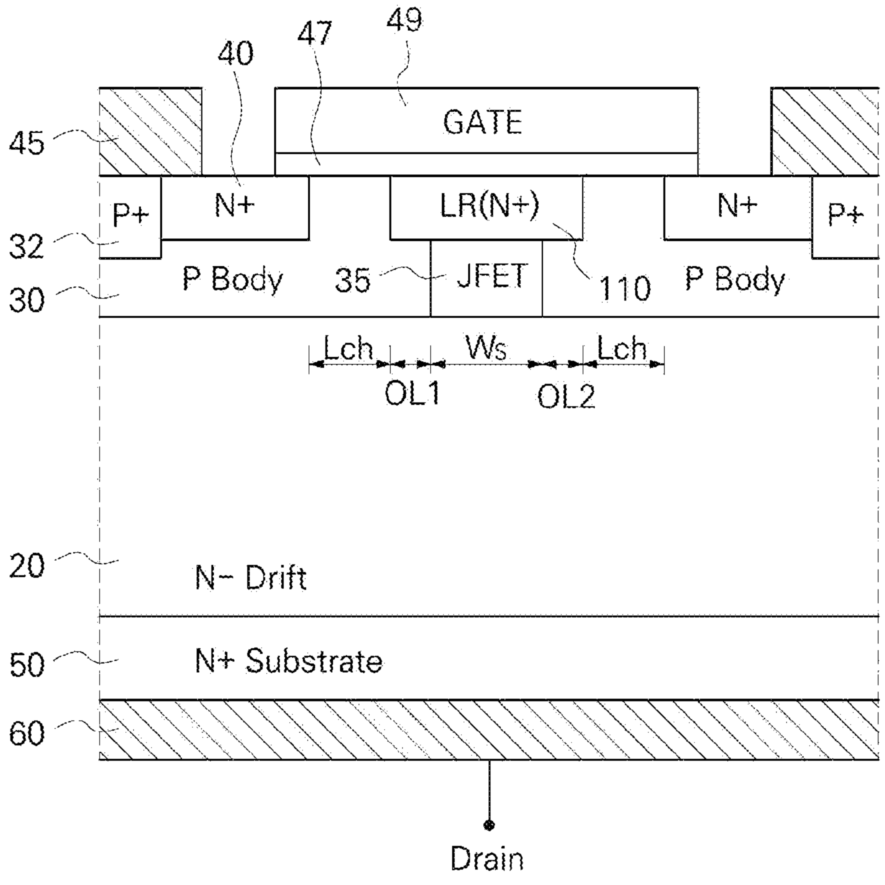
FIG. 2 is a cross-sectional view of a silicon carbide power MOSFET according to one embodiment of the present invention.
Figure 3:
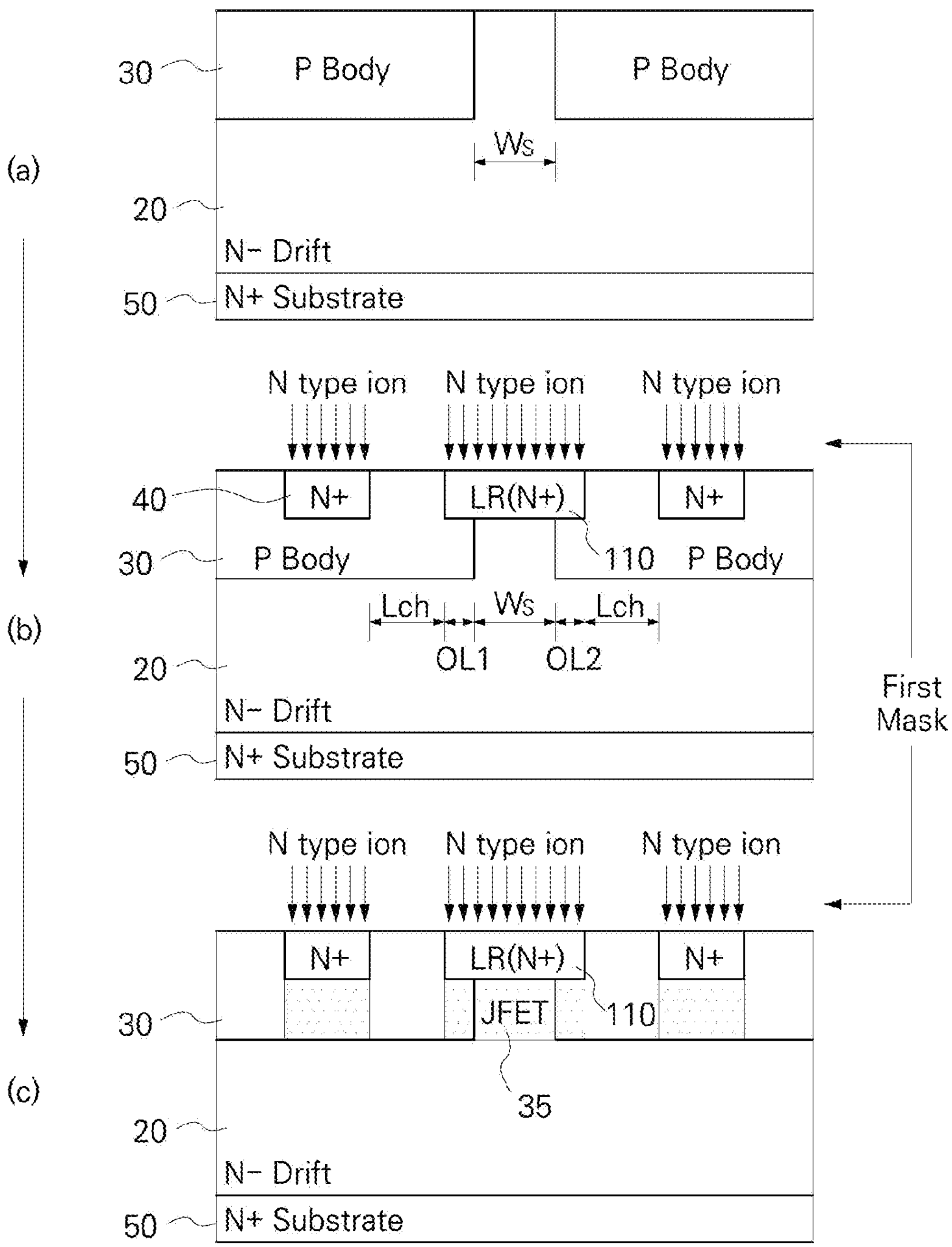
FIG. 3 and FIG. 4 are diagrams illustrating a manufacturing method of a silicon carbide power MOSFET according to one embodiment of the present invention.
Figure 4:
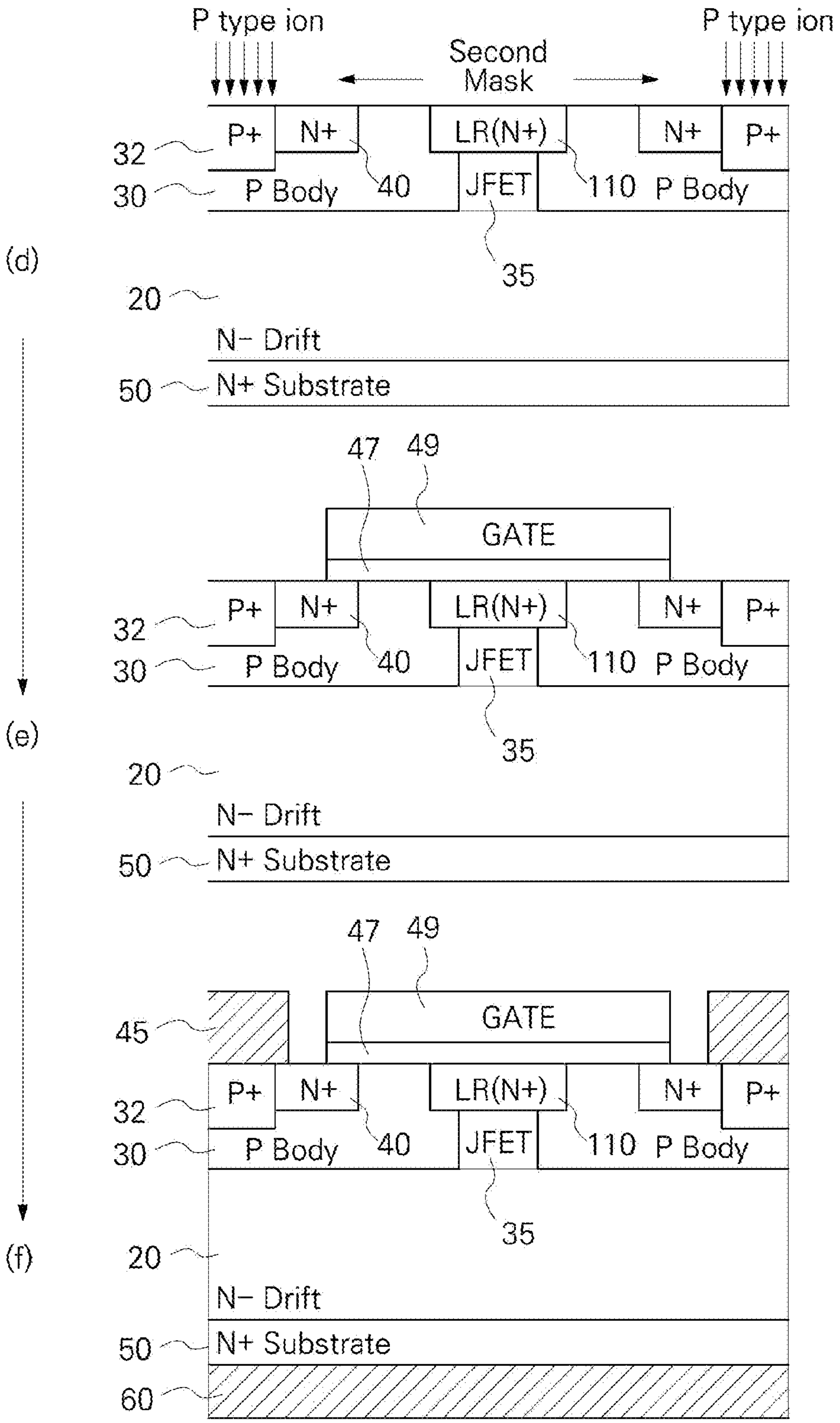
Figure 5:
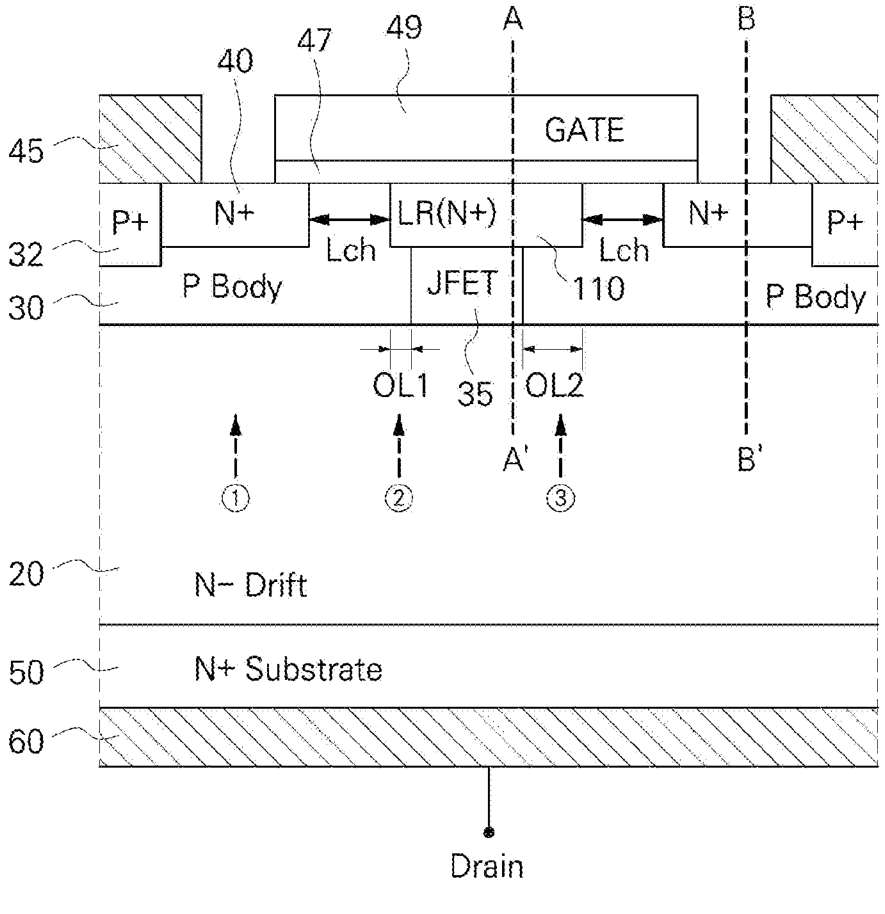
FIG. 5 is a cross-sectional view of a silicon carbide power MOSFET according to another embodiment of the present invention.
Figure 6:
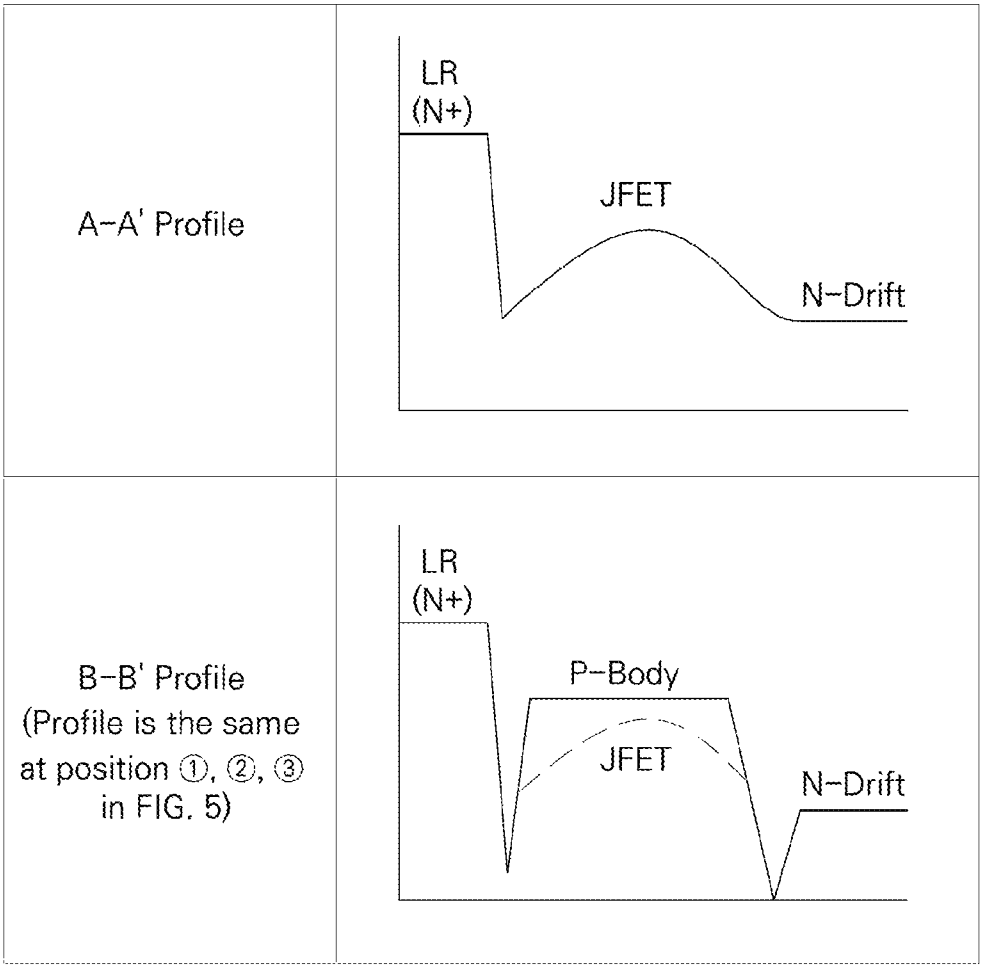
FIG. 6 and FIG. 7 show an impurity concentration profile according to a depth in a vertical direction of a silicon carbide power MOSFET according to embodiment of the present invention.
Figure 7:
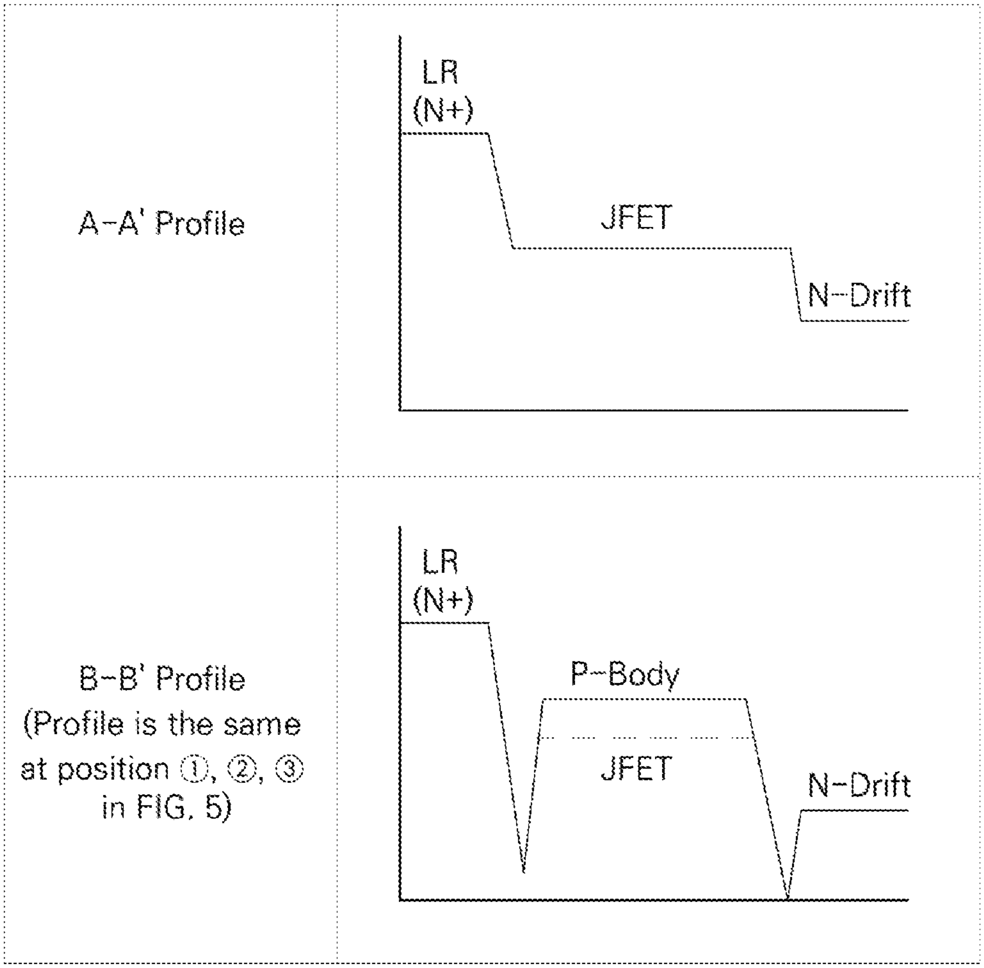

FIG. 2 is a cross-sectional view of a silicon carbide power MOSFET according to one embodiment of the present invention, FIG. 3 and FIG. 4 are diagrams illustrating a manufacturing method of a silicon carbide power MOSFET according to one embodiment of the present invention. FIG. 5 is a cross-sectional view of a silicon carbide power MOSFET according to another embodiment of the present invention. FIG. 6 and FIG. 7 show an impurity concentration profile according to a depth in a vertical direction of a silicon carbide power MOSFET according to embodiment of the present invention.

Referring to FIG. 2, a planar gate silicon carbide power MOSFET may be fabricated with a semiconductor substrate, which is an epitaxial substrate consisting of a silicon carbide semiconductor substrate 50 of an N+ conductivity type and a drift region 20 of an N− conductivity type formed on the semiconductor substrate 50. And a MOS structure may be formed on a surface region of the semiconductor substrate.

A plurality of body regions 30 of a P conductivity type may be formed to be spaced apart from each other in a horizontal direction in the surface region of the semiconductor substrate (namely, surface region of the drift region 20). A JFET region 35 may be formed in a lower region of the drift region 20 corresponding to a separation space between body regions 30. In an upper region of the drift region 20 corresponding to the separation space between the body regions 30, a low-resistance region 110 of the N+ conductivity type contacting the upper region of the JFET region 35 and extending to the upper surface of the semiconductor substrate may be formed.

The low-resistance region 110 may define a channel length and at the same time reduce resistance of an accumulation layer when current flows. The JFET region 35 may be also formed with a relatively high concentration compared to the drift region 20 to reduce resistance. The JFET region 35 may be formed with a relatively low ion concentration compared to the low-resistance region 110, but may be formed with an appropriate ion concentration in consideration of breakdown voltage characteristics.

A bottom depth of the JFET region 35 may correspond to a bottom depth of the body region 30, and the JFET region 35 may be formed with a spacing width length $W_S$ at which the body region 30 is spaced apart.

A bottom depth of the low-resistance region 110 may correspond to the bottom depth of the source region 40. And, the low-resistance region 110 may be formed to have a width length $W_S$+OL1+OL2, so as to be relatively longer than the spacing width length $W_S$ between body regions 30, to form an overlap region in the lateral direction by an overlap length OL1 with the adjacent body region 30 in a first direction, and to form an overlap region in the lateral direction by an overlap length OL2 with the adjacent body region 30 in a second direction which is opposite to the first direction.

The overlap lengths OL1 and OL2 may be values within a range from 0 (a state in which sidewalls of the low-resistance region 110 and the JFET region 35 are aligned and placed in a vertical position in the vertical direction) to a limit value. In consideration of misalignment margins that may occur in the lithographic process for defining and forming the source region 40 and the body region 30, respectively, the limit value of the overlap length may be set a value equal to or relatively larger than a preset misalignment margin so that an intended channel length can be secured under any circumstances.

In this way, a region in which the low-resistance region 110 can shift in a lateral direction relative to the JFET region 35 can be designated in advance as a range of overlap length, and accordingly, even if the source region 40 and the body region 30 are misaligned in the photo process, the channel length is uniformly maintained in all transistor cells.

The source region 40 of the N+ conductivity type may be formed in the surface region in the body region 30 to have the same bottom depth as the low-resistance region 110 and to be spaced apart from the low-resistance region 110 by a preset channel length Lch, and the contact region 32 of the P+ conductivity type may be formed to contact the source region 40 on the opposite side of the channel region.

The low-resistance region 110 and the source region 40, both of which are N+ conductivity type, may be formed together by the N conductivity type ion implantation using the same first mask.

Even when the JFET region 35 is formed, the same first mask may be used in common, even though the implanted ion concentration and formation depth are different.

In the process of forming the JFET region by commonly using the first mask, N conductivity type ions are also implanted into the body region 30 under the source region 40. In this case, the JFET region 35 may be formed to have an ion concentration significantly lower than that of the body region 30 so as not to affect the body region 30 by being compensated due to the difference in ion concentration with the body region 30.

For example, the JFET region 35 may be formed with a dose of 1e12/cm$^2$ or less, the body region 30 of the P conductivity type may be formed with a dose of 5e13/cm$^2$ or less, the source region 40 and the low-resistance region 110, both of which are N+ conductivity type, may be formed with a dose of 5e15/cm$^2$ or less, and the contact region 32 of the P+ conductivity type may be formed with a dose of 1e15/cm$^2$ or less.

A gate oxide 47 may be formed on the upper surface of the semiconductor substrate to span the body regions 30 adjacent to each other with the low-resistance region 110 therebetween, and a gate electrode 49 may be formed on the gate oxide 47. A source metal 45 may be formed on the upper surface of the semiconductor substrate so as to be electrically connected to the source region 40 and the contact region 32, and a drain metal 60 may be formed on the lower surface of the silicon carbide substrate 50.

As described above, since the source region 40 and the low-resistance region 110 are formed together using the same first mask, gaps between the low-resistance region 110 and the source regions 40 positioned on both sides, which is the channel length, may be matched. Therefore, the channel length may be uniformly implemented in all transistor cells of the silicon carbide power MOSFET.

The channel length may be defined by the low-resistance region 110 formed in the surface region of the semiconductor substrate using the first mask, and the width, length and ion concentration of the JFET region 35 formed between the body regions 30 may be determined as optimal values in consideration of a trade-off between on-resistance and breakdown voltage characteristics.

Hereinafter, a manufacturing process of the silicon carbide power MOSFET according to the present embodiment will be briefly described with reference to FIGS. 3 and 4.

As shown in (a) of FIG. 3, ions of the P conductivity type are implanted and activated into the upper surface layer of the semiconductor substrate, which is an epitaxial substrate having the drift region 20 of the N− conductivity type formed in the silicon carbide substrate 50 of the N+ conductivity type, to form a plurality of the body regions 30 of the P conductivity type spaced apart from each other by a preset width $W_S$ in the horizontal direction. The body region 30 may be formed with a dose of, for example, 5e13/cm$^2$ or less, and the implanted P conductivity type ion may be, for example, Al.

Subsequently, as shown in (b) of FIG. 3, the low-resistance region 110 of the N+ conductivity type may be formed in the upper region of the separation space between body regions 30 by implanting the N conductivity type ions with the first mask, and the source region 40 of the N+ conductivity type may be formed in the surface region of the body region 30 at a position spaced apart from the low-resistance region 110 by the preset channel length Lch.

The source region 40 and the low resistance region 110 may be formed with, for example, an ion implantation energy of 100 keV and a dose of 5e15/cm$^2$ or less, and the N conductivity type ions to be implanted may be, for example, N(Nitrogen), Ph (Phosphorus), and so on. The source region 40 and the low-resistance region 110 may be formed to have the same bottom depth.

The low-resistance region 110 may be formed with a relatively longer width than the width $W_S$ at which the body region 30 is spaced apart, for example, with a length of $W_S$+OL1+OL2 overlapping each of the body regions 30 on both sides within a range of 0 to each limit values OL1, OL2.

Here, when the source region 40 and the body region 30 are normally aligned, overlap lengths OL1, OL2 of the body region 30 on both sides may coincide with each other (see FIG. 2), and when the source region 40 and the body region 30 are misaligned with each other, overlap lengths OL1 and OL2 of the body regions 30 on both sides may be different from each other (see FIG. 5).

In order to secure the intended channel length under any circumstances, the limit values of the overlap length may be determined in advance to be a value that is equal to or relatively larger than a misalignment margin that can occur in the photo process for defining and forming the source region 40 and the body region 30, respectively.

Subsequently, as shown in (c) of FIG. 3, the JFET region 35 may be formed under the low resistance region 110 by applying the first mask that is the same mask used previously to inject the N conductivity type ions into the body region 30 under the source region 40 and the drift region 20 under the low-resistance region 110 and activate them.

In this way, since the first mask can be used identically for forming the JFET region 35, the number of masks required may be reduced and the complexity of the manufacturing process may be reduced.

In the process of forming the JFET region by using the first mask, although the N conductivity type ions are also implanted into the body region 30 under the source region 40, the JFET region 35 may be formed to have an ion concentration significantly lower than that of the body region 30 so as not to affect the body region 30 by being compensated due to the difference in ion concentration with the body region 30.

The JFET region 35 may be formed with a dose of 1e12/cm$^2$ or less while continuously increasing the ion implantation energy to, for example, 300 keV, 500 keV, 700 keV, etc., and the implanted N conductivity type ions may be, for example, N (Nitrogen), Ph (Phosphorus), and the like.

Subsequently, as shown in (d) of FIG. 4, a second mask may be applied to implant and activate P conductivity type ions, so as to form the contact region 32 of the P+ conductivity type to contact the source region 40 on the opposite side of the channel region. The contact region 32 may be formed with a dose of 1e15/cm$^2$ or less, and P-type ions to be implanted may be, for example, Al.

Referring to FIGS. 3(*a*) to 4(*d*), although the description has been made on the assumption that each region are formed in the order of the body region 30, the source region 40, the low-resistance region 110, the JFET region 35, and the contact region 32 in the surface region of the semiconductor substrate, it should be understood that that the order of their formation is not limited thereto.

Subsequently, as shown in (e) of FIG. 4, the gate oxide 47 may be formed on the upper surface of the semiconductor substrate to span the body regions 30 adjacent to each other with the low-resistance region 110 therebetween, and a gate electrode 49 may be formed on the gate oxide 47.

Subsequently, the source metal 45 may be formed on the upper surface of the semiconductor substrate so as to be electrically connected to the source region 40 and the contact region 32, and a drain metal 60 may be formed on the lower surface of the silicon carbide substrate 50.

As described above, since the source region 40 of the N+ conductivity type and the low-resistance region 110 are formed using the first mask, when the source region 40 and the body region 30 are normally aligned so that overlap lengths OL1, OL2 of the body region 30 on both sides coincide with each other (see FIG. 2), and even when the source region 40 and the body region 30 are misaligned with each other so that overlap lengths OL1 and OL2 of the body regions 30 on both sides do not coincide with each other (see FIG. 5), the channel length between the low-resistance region 110 and the source regions 40 on both sides becomes always constant.

FIGS. 6 and 7 each show an impurity concentration profile according to depth in the vertical direction of the silicon carbide power MOSFET. For reference, FIG. 6 shows a case where the ion implantation for forming the JFET region 35 is retrograde doped, and FIG. 7 shows a case where the ion implantation for forming the JFET region 35 is box-profiled.

In FIGS. 6 and 7, referring to the impurity concentration profile of the A-A' region, which is a section passing through the low-resistance region 110 and the JFET region 35 in the vertical direction, the JFET region 35 may be formed with a relatively low concentration compared to the low-resistance region 110 of the N+ conductivity type, but a relatively high concentration compared to the drift region 20 of the N− conductivity type.

Here, as shown in FIG. 6, when the JFET region 35 is formed by the retrograde doping method in which high-dose ions are implanted at a specific depth, from the view of resistance, it may be possible to obtain same effect of the box-shaped profile formed by multiple ion implantation with different energies, but it may be advantageous to improve the process efficiency due to the reduction in the number of ion implantation.

Here, N conductivity type ions may be implanted at a dose of, for example, $1e12/cm^2$ or more and less than $1e13/cm^2$, and a depth at which ions of the highest dose are implanted may be an intermediate position between the bottom depth of the low resistance region 110 and the bottom depth of the body region 30.

In addition, in FIGS. 6 and 7, referring to the impurity concentration profile of the region BB'(or the area within the overlap distance ①, ②, ③ is the same), which is a section passing through either one of the source region 40 and the low-resistance region 110 and the body region 30 in the vertical direction, the source region 40 and the low-resistance region 110 may be formed with a relatively high concentration compared to the body region 30, and the body region 30 may be formed with a relatively higher concentration than the N− conductivity type drift region 20.

In the process of forming the JFET region by using the first mask, although the N conductivity type ions are also implanted into the body region 30 under the source region 40 and the low-resistance region 110, the ions are implanted with significantly lower concentration than that of the body region 30 so as not to affect the body region 30 by being compensated due to the difference in ion concentration with the body region 30.

Up to now, the power semiconductor device has been described using the power MOSFET as an example, but it should be understood that the technical concept of the present invention may be applied and expanded to various types of power semiconductor devices such as IGBT in the same or similar manner.

As described above, the silicon carbide power semiconductor device according to the embodiments of the present invention has a feature of enhancing ruggedness of the device by uniformizing the channel length to prevent variation in current density per transistor cell during switching on/off and conduction. In addition, the mask for forming the source region 40 and the low-resistance region 110 and the mask for forming the JFET region 35 can be shared, thereby reducing the number of masks required in manufacturing the power semiconductor device and also reducing the complexity of the manufacturing process.

Although the above has been described with reference to the embodiments of the present invention, those of ordinary skill in the art can variously modify the present invention without departing from the spirit and scope of the present invention described in the claims below.

What is claimed is:

1. A method of manufacturing a power semiconductor device, comprising:

(a) forming a plurality of body regions of a second conductivity type to be spaced apart from each other with a preset separation width $W_S$ in a horizontal direction in an upper region of a drift region epitaxially grown on a silicon carbide substrate of a first conductivity type;

(b) forming, by an ion implant of the first conductivity type with a first mask, a low-resistance region of the first conductivity type in an upper region of a separation space between adjacent body regions of the plurality of body regions to contact side surfaces of the adjacent body regions, and forming a source region of the first conductivity type in a surface region in a body region of the plurality of body regions in contact with the low-resistance region to be spaced apart from the low-resistance region by a preset channel length; and (c) forming, by an ion implant of the first conductivity type with the first mask, a JFET region of the first conductivity type with a width equal to the separation width $W_S$ in a lower region of the separation space, wherein in (b), the low-resistance region forms an overlap region in a lateral direction by an overlap length OL1 with a first adjacent body region of the plurality of body regions in a first direction, and forms an overlap region in the lateral direction by an overlap length OL2 with a second adjacent body region of the plurality of body regions in a second direction opposite to the first direction so as to be formed with a width of $W_S$+OL1+OL2, wherein an ion implant concentration in (c) is set relatively lower than an ion implant concentration of the plurality of body regions so that the each body region of the plurality of body regions is maintained at a lower region of the source region and a lower portion of the low-resistance region that does not overlap with the plurality of body regions, wherein the source region and the low-resistance region are formed using the first mask, such that when the overlap length OL1 and the overlap length OL2 do not match each other due to misalignment between the source region and the plurality of body regions, the preset channel length between the low-resistance region and the source regions on both sides remains constant.

2. The method of claim 1, wherein the overlap lengths OL1 and OL2 that the low-resistance region forms with adjacent body regions do not match.

3. The method of claim 1, wherein ion implant doses used to form the plurality of body regions, the JFET region, the low resistance region, and the source region satisfy a relationship of: dose of low resistance region=dose of source region>dose of body region>dose of JFET region.

4. The method of claim 1, wherein each of the overlap lengths OL1 and OL2 is a value within a range from 0 to a preset limit value, wherein the preset limit value limiting the range of the region in which the low-resistance region is shiftable in the lateral direction relative to the JFET region is set to a value equal to or greater than a misalignment margin preset for a photolithography process of forming the source region and the plurality of body regions, wherein when each of the overlap lengths OL1 and OL2 is zero and the sidewalls of the low-resistance region and the JFET region are vertically aligned in a vertical direction.

5. The method of claim 1, wherein the plurality of body regions are formed by Al ion implant.

6. The method of claim 1, wherein the source region and the low resistance region are formed by ion implant of at least one of N (Nitrogen) and Ph (Phosphorus).

7. The method of claim 1, wherein the JFET region is formed by implanting the first conductivity type ions at a dose of $1e12/cm^2$ or more and less than $1e13/cm^2$ at an intermediate position from a bottom depth of the low-resistance region to a bottom depth of the body region.

* * * * *